United States Patent
Palmer et al.

(10) Patent No.: US 11,955,971 B2
(45) Date of Patent: Apr. 9, 2024

(54) INTEGRATED TRANSMITTER SLEW RATE CALIBRATION

(71) Applicant: Rambus Inc., San Jose, CA (US)

(72) Inventors: Robert E. Palmer, Chapel Hill, NC (US); Andrew Fuller, Durham, NC (US); Hsuan-Jung Su, Chapel Hill, NC (US)

(73) Assignee: Rambus Inc., San Jose, CA (US)

( * ) Notice: Subject to any disclaimer, the term of this patent is extended or adjusted under 35 U.S.C. 154(b) by 6 days.

(21) Appl. No.: 17/590,668

(22) Filed: Feb. 1, 2022

(65) Prior Publication Data

US 2022/0255550 A1 Aug. 11, 2022

Related U.S. Application Data (60) Provisional application No. 63/199,999, filed on Feb. 8, 2021.

(51) Int. Cl.

| | |
|---|---|
| *G11C 7/10* | (2006.01) |
| *G01R 31/3193* | (2006.01) |
| *G11C 11/4076* | (2006.01) |
| *H03K 19/094* | (2006.01) |

(52) U.S. Cl.
CPC . *H03K 19/09429* (2013.01); *G01R 31/31937* (2013.01); *G11C 7/1057* (2013.01); *G11C 7/1084* (2013.01); *G11C 11/4076* (2013.01)

(58) Field of Classification Search
CPC ........ H03K 19/09429; G01R 31/31937; G11C 7/1057; G11C 7/1084; G11C 11/4076; G11C 11/4093; G11C 29/028; G11C 29/50012; G11C 2207/2254
See application file for complete search history.

(56) References Cited

U.S. PATENT DOCUMENTS

| | | |
|---|---|---|
| 7,038,512 B2 | 5/2006 | Wilson et al. |
| 7,646,229 B2 | 1/2010 | Mei |
| 7,808,268 B2 | 10/2010 | Bucossi et al. |
| 10,175,297 B2 | 1/2019 | Cilek et al. |
| 10,825,507 B2 | 11/2020 | Watanabe |
| 2006/0197568 A1* | 9/2006 | Takagi ............... H03K 5/01 327/170 |
| 2010/0322022 A1* | 12/2010 | Shinozaki .......... G11C 7/222 365/194 |

* cited by examiner

*Primary Examiner* — Sultana Begum
(74) *Attorney, Agent, or Firm* — Lowenstein Sandler LLP (57) ABSTRACT

An integrated circuit comprises a signal transmitter and a sampling circuit coupled to the signal transmitter, wherein the sampling circuit is to sample output voltage levels of an output of the signal transmitter at different respective times. The integrated circuit further comprises a measurement circuit coupled to the sampling circuit, wherein the measurement circuit is to compare the output voltage levels of the output of the signal transmitter to corresponding reference voltages to identify a first time when a first output voltage level equals a first reference voltage and a second time when a second output voltage level equals a second reference voltage. A time difference between the first time and the second time is used to configure a slew rate adjustment control of the signal transmitter.

20 Claims, 6 Drawing Sheets

INTEGRATED TRANSMITTER SLEW RATE CALIBRATION

RELATED APPLICATIONS

This application claims the benefit of priority from U.S. Provisional Application No. 63/199,999, filed Feb. 8, 2021, which is hereby incorporated in its entirety herein by reference.

BACKGROUND

An output driver circuit in an integrated circuit is used to output a signal representing an internal data state through an output terminal. As the internal data state changes, a voltage level of the output signal also changes to reflect the change in the data state.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Aspects of the present disclosure include a signal transmitter slew rate compensation scheme implemented by a slew rate calibration circuit. The slew rate calibration circuit manages the rate of change of transmitted signals from one state to another (e.g., from a low voltage state representing a logical "0" to a high voltage state representing a logical "1"). The slew rate can thus be expressed as a change in voltage, current, or other quantity, per unit of time. In one embodiment, a sampling circuit in a signal transmitter captures narrow-aperture samples of the output of a replica transmitter which is stimulated with a source clock. The output samples can be captured at a programmable time offset and compared by, for example, an electronic measurement unit (EMU) circuit to a reference voltage representing a certain point in the transition of the output signal from one state to another (e.g., from a low state to a high state). The output of the EMU circuit is thus a binary comparator output value, which is fed back to a control logic. Based on the comparator output value, the control logic determines whether and how the programmable time offset should be adjusted, and generates a corresponding code for a phase interpolator that represents a time when the replica transmitter output is equal to the reference voltage. In this manner, respective times can be established for two or more reference voltages in the transition of the replica transmitter output signal, and control logic can determine a difference between the respective times, where the difference represents a measured slew rate. Depending on a variance of the measured slew rate from a target or other desired slew rate, a slew rate control signal can be applied to calibrate (i.e., adjust) the slew rate of the signal transmitter.

In one embodiment, the slew rate calibration circuit can be implemented in a buffer chip (e.g., a command buffer, or a data buffer) of a memory module. Certain descriptions of the operation of the slew rate calibration circuit are provided herein with respect to this embodiment, for ease of understanding. It should be understood, however, that this implementation is merely one example, and that the slew rate calibration circuit and associated slew rate control operations are equally applicable to any number of other implementations. For example, the slew rate control and calibration described herein could alternatively be implemented in a memory device (e.g., a dynamic random access memory (DRAM) device), a controller circuit (e.g., a memory controller), a system-on-a-chip (SoC) or any other integrated circuit.

Benefits that can be realized with certain embodiments of the approach described herein include, but are not limited to, the use of existing circuits that are available in on-chip delay compensation loops (e.g., a replica transmitter and phase interpolator) and regulated supply calibration circuits (e.g., DAC and auto-zero comparator). In addition, slew rate compensation based on a full transmitter replica includes all relevant circuit effects, and may eliminate the need for an additional delay locked loop (DLL) to compensate the pre-driver delay elements. Furthermore, the direct sampling approach described herein supports independent rise/fall slew rate trim, and in principle calibration of other transmitter characteristics (e.g. feed-forward EQ levels, output driver duty cycle, etc.). Additional details of integrated slew rate calibration are provided below with respect to FIGS. 1-5.

Figure 1:
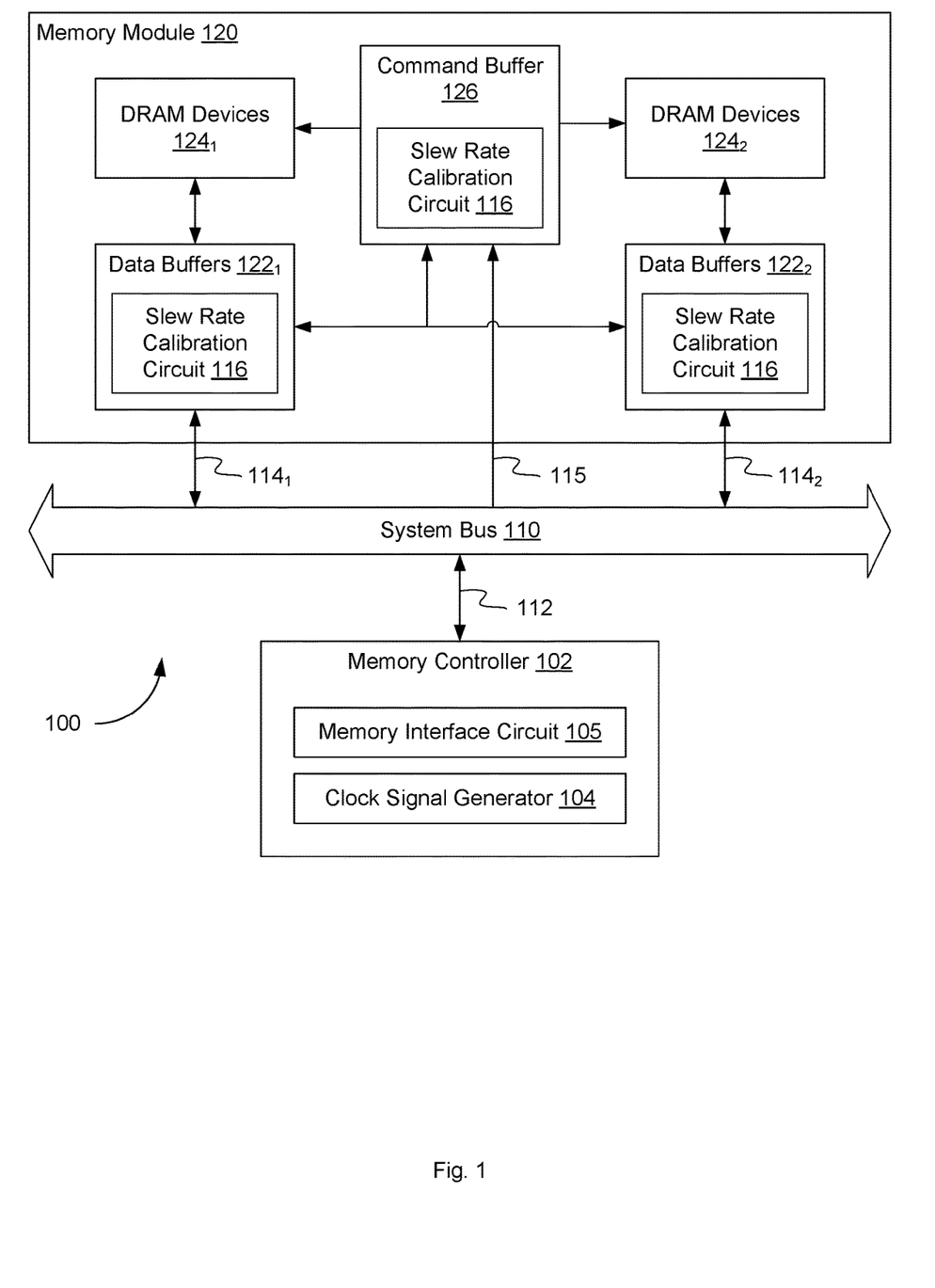
FIG. 1 is a block diagram illustrating a computing environment with circuitry implementing signal transmitter slew rate compensation, according to an embodiment.

FIG. 1 depicts an environment 100 showing a memory module 120. As an option, one or more instances of environment 100 or any aspect thereof may be implemented in the context of the architecture and functionality of the embodiments described herein.

As shown in FIG. 1, environment 100 comprises a memory controller 102 coupled to a memory module 120 through a system bus 110. In one embodiment, memory module 120 is a dual in-line memory module (DIMM). Such memory modules can be referred to as DRAM DIMMs, registered DIMMs (RDIMMs), or load-reduced DIMMs (LRDIMMs), and can share a memory channel with other DRAM DIMMs.

In one embodiment, the memory controller 102 comprises a clock signal generator 104 and a memory interface circuit 105. Memory controller 102 can comprise multiple instances each of clock signal generator 104, and memory interface circuit 105. The memory controller 102 can further include a cache memory, which can be dedicated to a single processing core or shared with other cores. Clock signal generator 104 may include a phase lock loop (PLL) or other circuit to generate one or more clock signals. In other embodiments, clock signal generator 104 may receive one or more clock signals from a source external to the memory controller 102. In either embodiment, memory interface circuit 105 may include a driver to drive the one or more clock signals from clock signal generator 104 out of memory controller 102 (e.g., to components such as a register clock driver (RCD) or buffer chips on memory module 120).

The memory interface circuit 105 of the memory controller 102 communicates with the memory module 120 through the system bus 110 using a signaling interface 112. Specifically, the memory interface circuit 105 can write data to and/or read data from multiple sets of DRAM devices $124_1$-$124_2$ using a data bus $114_1$ and a data bus $114_2$, respectively. For example, the data bus $114_1$ and the data bus $114_2$ can transmit the data as electronic signals such as a data signal, a chip select signal, and/or a data strobe signal. In one embodiment, data bus $114_1$ and data bus $114_2$ can each include two or more groups of multiple data signals (e.g., four data signals per group), with each group having a corresponding strobe signal or signals, generated by clock signal generator 104. Memory interface circuit 105 can transmit the data signals together with the strobe signals to memory module 120 over system bus 110 and either data bus $114_1$ or data bus $114_2$.

The DRAM devices $124_1$-$124_2$ in memory module 120 can each comprise an array of memory devices (e.g., SDRAM) arranged in various topologies (e.g., A/B sides, single-rank, dual-rank, quad-rank, etc.). In some cases, as shown, the data to and/or from the DRAM devices $124_1$-$124_2$ can be buffered by a set of data buffers $122_1$ and data buffers $122_2$, respectively. Such data buffers can serve to redrive the signals (e.g., data or DQ signals, etc.) on the system bus 110 to help mitigate high electrical loads of large computing and/or memory systems. For example, the data buffers can include a signal transmitter circuit to transmit the signals. In one embodiment, data buffers $122_1$ and data buffers $122_2$ include an instance of slew rate calibration circuit 116 to calibrate the slew rate of signals transmitted to DRAM devices $124_1$-$124_2$, and/or to memory controller 102. As described in more detail below, calibration circuit 116 can include a sampling circuit that captures narrow-aperture samples of an output of a replica transmitter in the signal transmitter circuit of one of data buffers $122_1$ and/or data buffers $122_2$ at a programmable time offset. Calibration circuit 116 further includes an electronic measurement unit (EMU) circuit which compares the captured output samples to certain reference voltages and generates comparator results. In one embodiment, control logic receives the output of the EMU circuit and processes the comparator results to adjust a time offset of the sampling circuit such that the sampled voltage equals a programmed reference voltage. In one embodiment, this programmable time offset of the sampling circuit is implemented using a phase interpolator where the time codes of the phase interpolator can be adjusted to optimally align the interpolated clock to the output of the replica transmitter circuit. The time codes represent times when the replica transmitter output is equal to the reference voltages (e.g., defined levels during a transition from a high to low voltage state or vice versa). In this manner, respective times can be established for two or more reference voltages in the transition of the replica transmitter output signal, and control logic (e.g., control logic internal to data buffers $122_1$ and data buffers $122_2$ or memory controller 102) can determine a difference between the respective times, where the difference represents the measured slew rate. Depending on a variance of the measured slew rate from a target or other desired slew rate, a slew rate control signal can be applied to calibrate (i.e., adjust) the slew rate of the signal transmitter in data buffers $122_1$ and data buffers $122_2$.

Further, command/address signals from the memory interface circuit 105 can be received by a command buffer 126, such as a register clock driver (RCD), at the memory module 120 using a command and address (CA) bus 115. For example, the command buffer 126 might be an RCD such as included in registered DIMMs (e.g., RDIMMs, LRDIMMs, etc.). Command buffers such as command buffer 126 can comprise a logical register and a phase-lock loop (PLL) to receive and re-drive command and address input signals from the memory controller 102 to the DRAM devices on a DIMM (e.g., DRAM devices $124_1$, DRAM devices $124_2$, etc.), reducing clock, control, command, and address signal loading by isolating the DRAM devices from the memory controller 102 and the system bus 110. In some cases, certain features of the command buffer 126 can be programmed with configuration and/or control settings. In one embodiment, command buffer 126 receives a number of command/address signals together with at least one clock signal from memory controller 102 via CA bus 115. In one embodiment, command buffer 126 includes an instance of slew rate calibration circuit 116 to calibrate the slew rate of signals transmitted to DRAM devices $124_1$-$124_2$, and/or to memory controller 102.

The memory module 120 shown in environment 100 presents merely one partitioning. In other embodiments, in addition or in the alternative, memory module 120 may include other volatile memory devices, such as synchronous DRAM (SDRAM), Rambus DRAM (RDRAM), static random access memory (SRAM), etc. The specific example shown where the command buffer 126 and the DRAM devices $124_1$-$124_2$ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives. In addition, memory controller 102 may include additional and/or different components than those illustrated in FIG. 1. Furthermore, the illustrated components may be arranged differently depending on the embodiment. Although depicted in FIG. 1 as being part of data buffers $122_1$ and data buffers $122_2$ or command buffer 126, as described above, slew rate calibration circuit 116 can alternatively or additionally be implemented in any other component of memory module 120, environment 100, or some other computing device or circuit.

Figure 2:
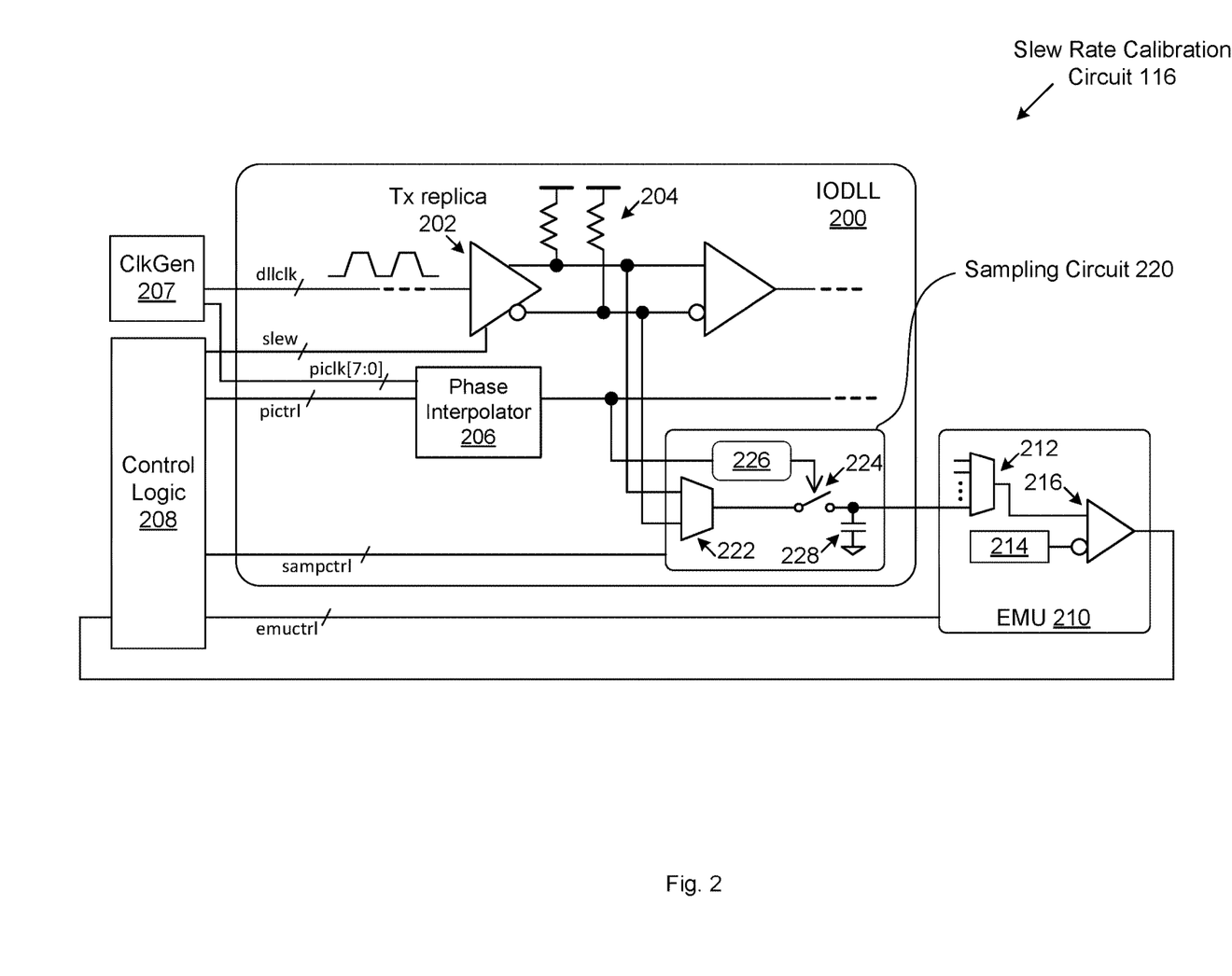
FIG. 2 is a block diagram illustrating a slew rate calibration circuit, according to an embodiment.

FIG. 2 is a block diagram illustrating a slew rate calibration circuit, according to an embodiment. In one embodiment, the slew rate calibration circuit 116 can be part of a data buffer or a command buffer, as illustrated in FIG. 1, or part of some other circuit. In one embodiment, slew rate calibration circuit 116 determines an optimal digital slew rate control value based on a set of transition time measurements made with an on-chip transmitter replica (e.g., replica signal transmitter 202) to compensate the transmitter slew rate for process variations. In one embodiment, a clock generator (ClkGen) 207 provides a first clock signal 'dllclk' to the replica signal transmitter 202 and a second, multi-phase, clock signal 'piclk[7:0]' to a phase interpolator 206.

In one embodiment, the replica signal transmitter 202 is fitted with a nominal test load (e.g., by adjustable resistor network 204) and is stimulated to produce a toggling output. A clock is sourced from a phase interpolator 206 to trigger a narrow-aperture voltage sample of the replica transmitter output waveform, which is compared against a reference voltage. High and low voltage measurement points corresponding to the desired transition time measurement are generated by the voltage reference in successive measurements. For each applied voltage reference, the timing of phase interpolator 206 is adjusted to find the time at which the sampled voltage equals the voltage reference. The difference between the measurement times associated with the high and low voltage measurement points is calculated and recorded. The task is repeated for all slew rate settings, and the resulting table of calibration setting versus measured transition time is used to determine the optimal calibration settings for one or more target slew rate configurations.

As shown in FIG. 2, a certain electronic device can include an existing delay locked loop (DLL) circuit such as input/output delay locked loop (IODLL) 200, including replica circuit elements, such as replica signal transmitter 202 and a replica signal receiver. In one embodiment, one or more of these replica circuit elements can be repurposed for use in slew rate calibration circuit 116 (e.g., during a production test mode or otherwise). In addition, an existing analog to digital converter (ADC) can be repurposed as a measurement circuit (i.e., electronic measurement unit (EMU) 210). Depending on the embodiment, the ADC can be either a fully circuit-based ADC or a successive approximation-based ADC using control logic 208. In one embodiment, EMU 210 includes selection circuit 212 (e.g., a multiplexer), reference voltage source 214, and comparator 216. Additional details associated with the use of EMU 210 in slew rate calibration circuit 116 are provided below. Furthermore, the electronic device can include control logic 208, such as control logic implemented on-chip of the data buffer, for example, or separate from the memory module (e.g., memory controller 102).

In one embodiment, slew rate calibration circuit 116 further includes sampling circuit 220. Sampling circuit 220 includes a selection circuit 222 (e.g., a multiplexer), a switching circuit 224 controlled by a pulse generator 226, and a storage element 228 (e.g., a capacitor). In one embodiment, two or more outputs (i.e., signal waveforms) of the replica signal transmitter 202 (e.g., the true output and the complement output) are received at selection circuit 222. According to a control signal "sampctrl" received from control logic 208, selection circuit 222 can select one of the two or more outputs of the replica signal transmitter 202 and apply the selected output to switching circuit 224. In one embodiment, switching circuit 224 is controlled by pulse generator 226 based on a control clock received from phase interpolator circuit 206. On each rising edge of the output signal of phase interpolator circuit 206, pulse generator 226 generates a narrow pulse that will momentarily activate and deactivate switching circuit 224. Thus, a narrow-aperture sample of the selected output signal from replica signal transmitter 202 is taken representing a specific point in time corresponding to the associated control codes of phase interpolator circuit 206. In one embodiment, the output signal is repetitively sampled causing charge to accumulate on capacitor 228 until a steady-state sample voltage is established. Accordingly, sampling circuit 220 can determine a series of output voltage levels associated with the replica signal transmitter 202, where each output voltage level corresponds to a different time represented by a control code of the phase interpolator circuit 206. In another embodiment, instead of sampling circuit 220 and EMU 210, slew rate calibration circuit 116 can implement a high-bandwidth sampling and comparator circuit, which can produce a comparator output result using a single sample.

Although FIG. 2 illustrates an embodiment utilizing replica signal transmitter 202, it should be understood that in other embodiments a transmitter replica may not be used. In another embodiment, slew rate calibration circuit 116 can receive signals from a non-replica signal transmitter which can be located on the same or a different chip. For example, sampling circuit 220 can receive the output signal waveforms from this non-replica signal transmitter, and perform the sampling as described above. Thus, depending on the embodiment, the source of the input waveforms (e.g., replica signal transmitter 202 or a non-replica signal transmitter), sampling circuit 220, EMU 210, and control logic 208 can be physically arranged in different locations (e.g., on different chips). For example, at least one of the above components can be located in a different location than the remaining components.

Figure 3:
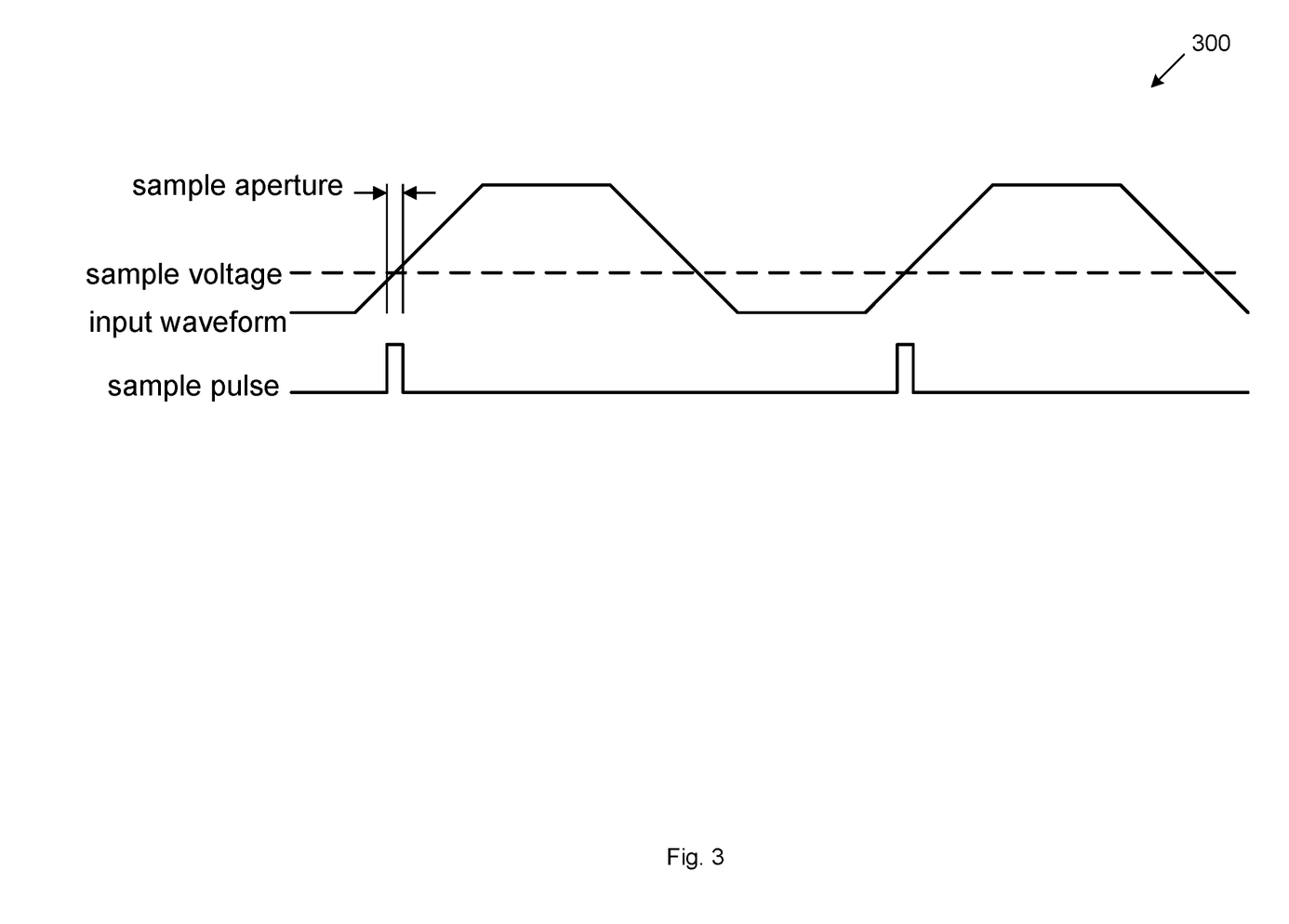
FIG. 3 is a diagram illustrating narrow-aperture sampling of a signal waveform for signal transmitter slew rate compensation, according to an embodiment.

FIG. 3 is a diagram illustrating narrow-aperture sampling of a signal waveform for signal transmitter slew rate compensation, according to an embodiment. In the diagram 300, the input waveform (i.e., the waveform being input to and sampled by sampling circuit 220) represents the output of replica signal transmitter 202 (e.g., the selected output from selection circuit 222). As illustrated the input waveform periodically transitions from one state (e.g., a low voltage state) to another state (e.g., a high voltage state). The sample pulse waveform represents the output of pulse generator 226 and corresponds to a specific point in time represented by a control code of phase interpolator circuit 206. As described above, the narrow pulse in the sample pulse waveform will momentarily activate and deactivate switching circuit 224 (i.e., for a period of time represented by the "sample aperture") allowing charge to accumulate on capacitor 228. After reaching steady state, that amount of charge is indicative of the sample voltage, and represents the output voltage level of the input waveform (i.e., the selected output of replica signal transmitter 202) at the specific point in time during the signal transition from the first state to the second state. Although not illustrated in FIG. 3, there can be multiple sample pulses, allowing sampling circuit 220 to identify different sample voltages occurring at different points in time. Thus, depending on the time at which the sample pulse occurs (i.e., according to the corresponding control code of phase interpolator circuit 206) a different sample voltage can be determined. In another embodiment slew rate calibration circuit 116 can include multiple phase interpolator circuits (e.g., phase interpolator 206), multiple sampling circuits (e.g., sampling circuit 220), and/or multiple EMUs (e.g., EMU 210). In this embodiment, slew rate calibration circuit can sample multiple points of the output waveform in parallel. Even without multiple EMUs, the capacitors for multiple sampling circuits can be charged in parallel and then read out one at a time to the EMU 210 (e.g., using multiplexer 212).

Referring again to FIG. 2, the voltage stored on capacitor 228 (i.e., the sample voltage) is applied to measurement circuit 210. In one embodiment, any number of voltage signals, including the voltage stored on capacitor 228 are received at selection circuit 212 of measurement circuit 210. Depending on the embodiment, there can be any number of other sampling circuits (e.g., similar to sampling circuit 220) which also utilize measurement circuit 210 and, thus, are connected to selection circuit 212. According to a control signal "emuctrl" received from control logic 208, selection circuit 212 can select the output of sampling circuit 220 and apply the selected output to comparator circuit 216. Comparator circuit 216 compares the selected output of sampling circuit 220 to a reference voltage received from reference voltage source 214. Depending on the embodiment, the reference voltage can vary, such as between a first reference voltage and a second reference voltage. For example, the first reference voltage can be a low reference voltage associated with a transition of the output of the replica signal transmitter 202 from a first voltage state to a second voltage state, and the second reference voltage can be a high reference voltage associated with the transition of the output of the replica signal transmitter 202 from the first voltage state to the second voltage state.

Figure 4:
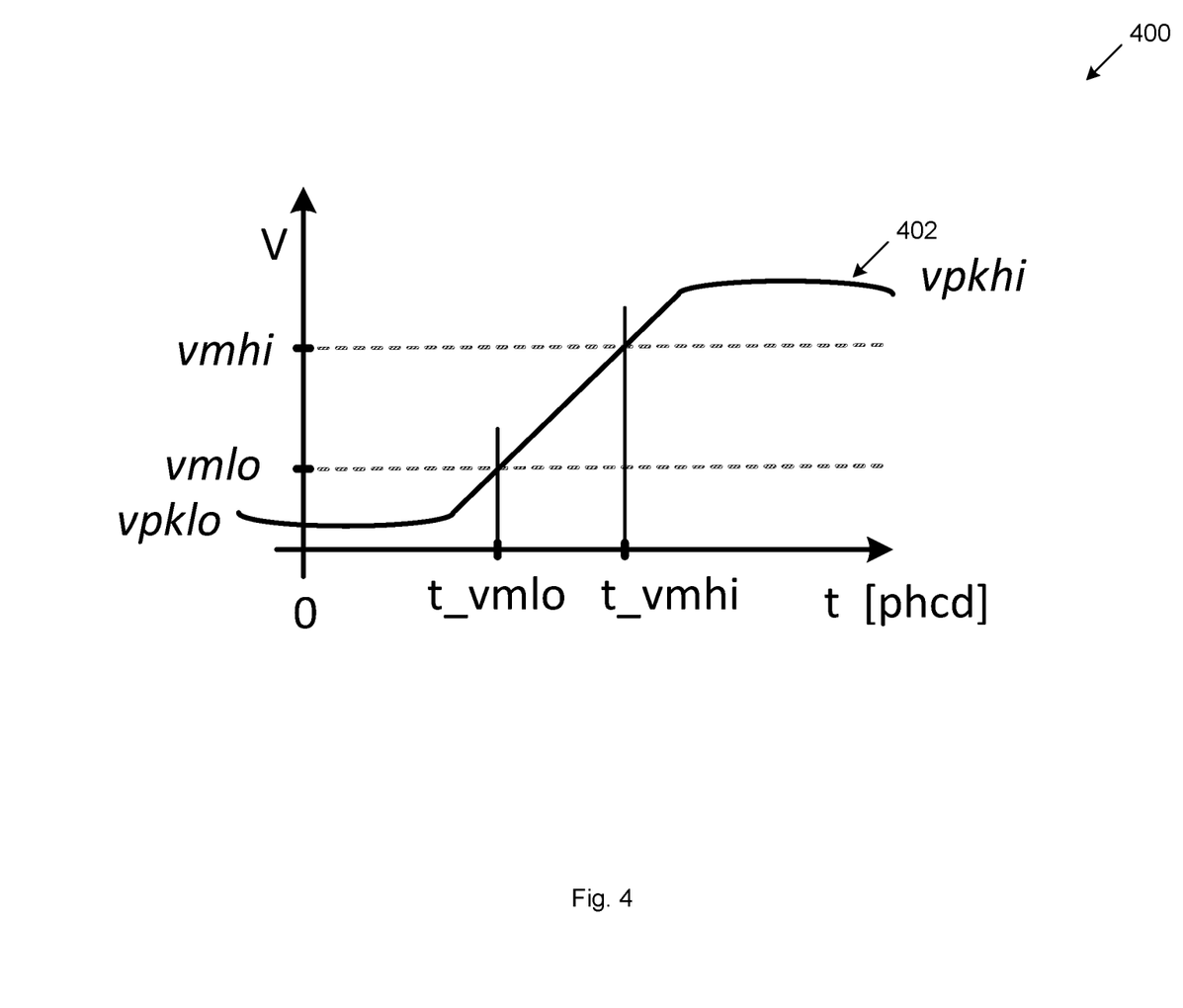
FIG. 4 is a diagram illustrating reference voltages for signal transmitter slew rate compensation, according to an embodiment.

FIG. 4 is a diagram illustrating reference voltages for signal transmitter slew rate compensation, according to an embodiment. In the diagram 400, the illustrated waveform 402 (i.e., the waveform being input to and sampled by sampling circuit 220) represents the output of replica signal transmitter 202 (e.g., the selected output from selection circuit 222). The diagram 400 illustrates one rising edge transition of the waveform 402 from a first low voltage state to a second high voltage state. In the diagram 400, time is represented by the x-axis and the respective voltage levels and states are represented by the y-axis. The diagram 400 further illustrates two reference voltages, including a first low reference voltage (vmlo) and a second high reference voltage (vmhi). These reference voltages are two examples of the reference voltage which can be applied to comparator circuit 216 from reference voltage source 214.

Depending on the embodiment, the reference voltages can represent two or more voltages associated with the transition of the waveform 402 from the first voltage state to the second voltage state. The high and low reference voltages (i.e., vmhi and vmlo) can be calculated based on a known swing of the signal transmitter (e.g., replica signal transmitter 202), or from explicitly measured high and low peak voltages (i.e., vpkhi and vpklo). In one embodiment, the reference voltages are calculated as shown in Equation 1 and Equation 2.

$$vmlo = vpklo + 0.25*(vpkhi - vpklo) \quad (1)$$

$$vmhi = vpkhi - 0.25*(vpkhi - vpklo) \quad (2)$$

In Equation 1 and Equation 2, the multiplication factor of 0.25 corresponds to a 25%-75% transition time measurement, where the low and high reference voltages represent 25% and 75% of the peak to peak voltage swing, respectively. In other embodiments, other factors can be used, such as 20%-80%, 15%-85%, etc. The times at which waveform 402 reaches the reference voltages vmlo and vmhi can be referred to as t_vmlo and t_vmhi, respectively. Although diagram 400 illustrates the transition of waveform 402 for a rising edge, a similar calculation can also be made for the transition associated with a falling edge (i.e., the transition from the high voltage state to the low voltage state).

Referring again to FIG. 2, the measurement circuit 210 compares one of the first reference voltage or the second reference voltage (e.g., vmlo or vmhi) to comparator 216. In one embodiment, slew rate calibration circuit 116 incrementally applies phase interpolator delay (i.e., applies voltage samples from different times to comparator 216), until the comparator output switches. For example, if a rising edge measurement is being analyzed, the output of comparator 216 will switch from low to high and if a falling edge measurement is being analyzed, the output of comparator 216 will switch from high to low. Upon such a switch which indicates that the sampled output voltage level of replica signal transmitter 202 equals the current reference voltage, control logic 208 can record the associated time (e.g., represented by the current control code of phase interpolator 206). The above process can then be repeated for the other of the first or second reference voltage. Control logic 208 can further calculate and record the difference between the two measured times and apply a modulo operation with the cycle time (t_cyc) as shown in Equation 3 and Equation 4.

$$\text{Rising edge: } (t\_vmhi - t\_vmlo)\%t\_cyc \quad (3)$$

$$\text{Falling edge: } (t\_vmlo - t\_vmhi)\%t\_cyc \quad (4)$$

In one embodiment, the operations described above are performed for rising and falling edges, for each of the true/complement outputs of replica signal transmitter 202. The mid-range of the four results can be calculated and stored as the representative value for the applied slew rate calibration setting (i.e., the signal "slew" applied to replica signal transmitter 202). In another embodiment, separate calculations for rising and falling transition time results can be stored. The process can be repeated for every slew rate calibration setting, and the optimal value for a given target slew rate is determined by identifying which calibration setting minimizes error in measured transition times as compared to a target transition time. The optimal values for multiple slew rate configurations can also be determined with this approach (e.g. multiple compensated slew rate settings per transmitter, and/or unique slew rate targets across different transmitter instances). As described with respect to FIG. 2, the signal transmitter (e.g., replica signal transmitter 202) relies on a digital slew rate control value "slew" to set a respective output slew rate. In another embodiment, however, control logic 208 can include a digital-to-analog converter (DAC) to convert that digital slew rate control value to an analog signal, which can be provided to the signal transmitter instead.

In another embodiment, the above described calibration can be performed for multiple phases of the clock signal 'dllclk' from clock generator 207 that drives the replica signal transmitter 202. This moves the measurement through different parts of the phase interpolator phase space, allowing integral nonlinearity to be averaged out. Calibrating in this manner can minimize the error term due to interpolator nonlinearity in phase interpolator 206.

Figure 5A:
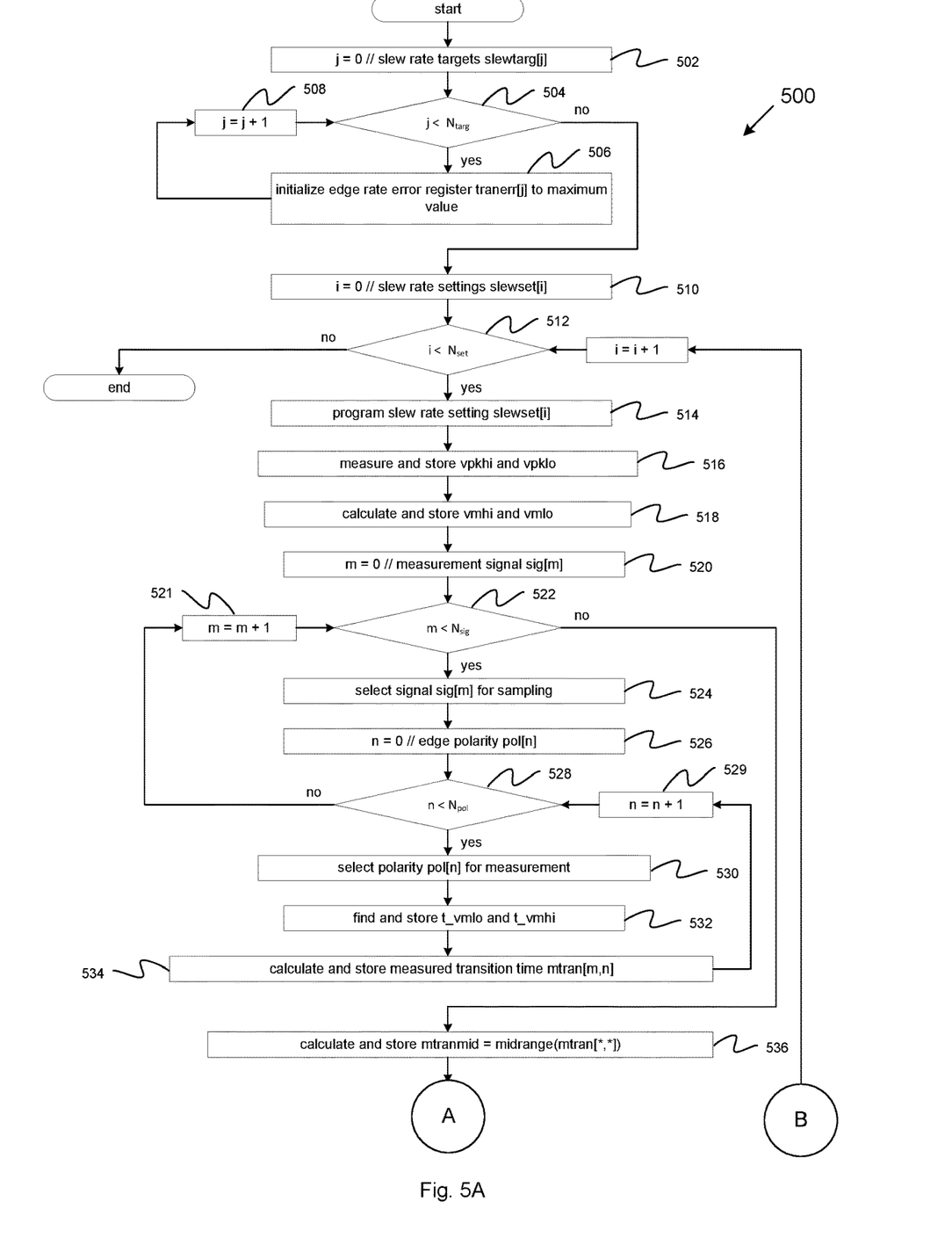
FIGS. 5A and 5B are flow diagrams illustrating a method of signal transmitter slew rate compensation, according to an embodiment.
Figure 5B:
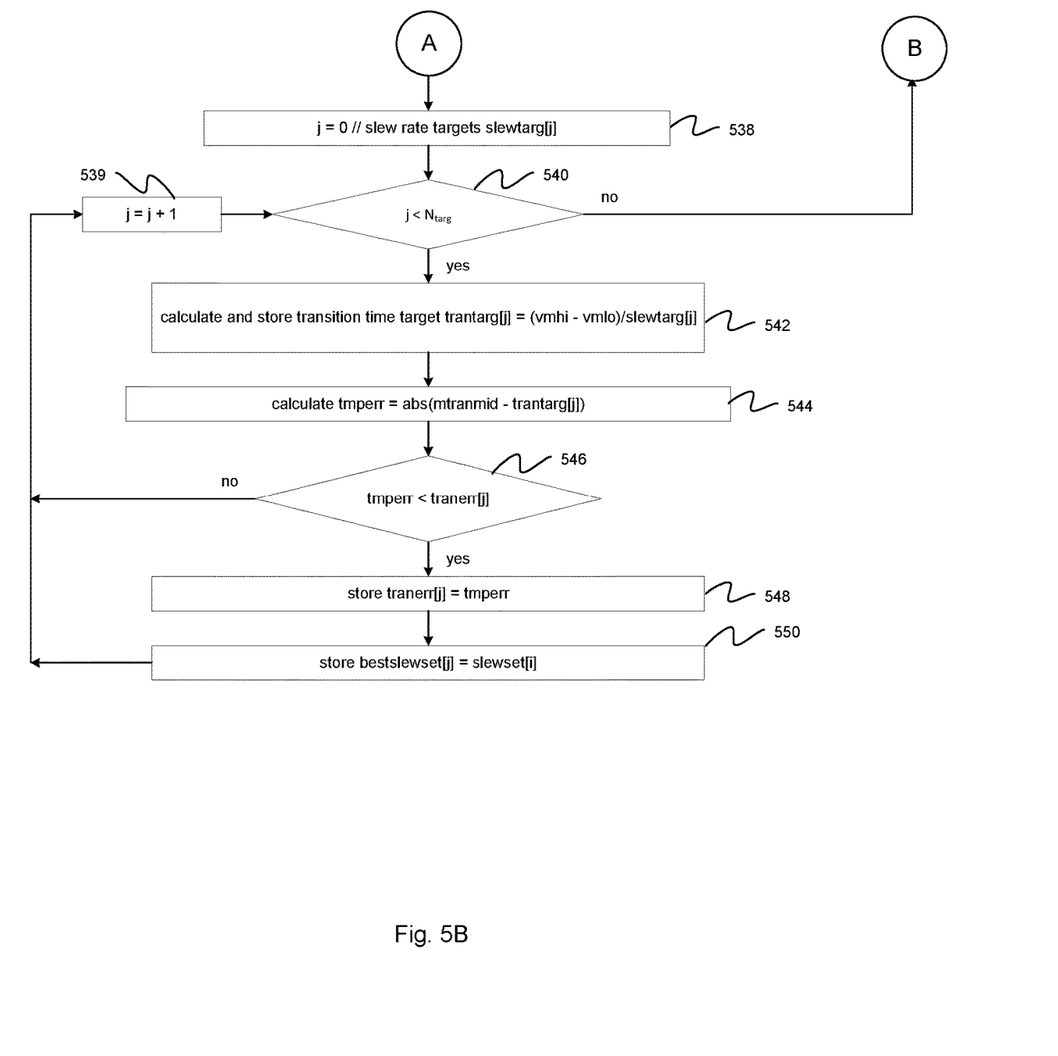

FIGS. 5A and 5B are flow diagrams illustrating a method of signal transmitter slew rate compensation, according to an embodiment. The method 500 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 500 is performed by slew rate calibration circuit 116 and control logic 208, as shown in FIGS. 1 and 2. The method 500 determines an optimal slew rate setting for each of $N_{targ}$ target slew rates (slewtarg[j], j=0 ... $N_{targ}$-1). For each target slew rate, the processing logic tests a number of slew rate settings (slewset[i], i=0 ... $N_{set}$] and selects the one whose measured edge rate coming out of the replica signal transmitter 202 is closest to the edge rate corresponding to the target slew rate. These optimal slew rate settings can be stored in a set of variables (bestslewset[j], j=0 ... $N_{targ}$-1) which produce a lookup table between target slew rate and optimal slew rate setting.

As shown in FIG. 5A, the value j of a counter for a number of slew rate targets is initialized to 0 (502) and as long as value j remains below the total number of slew rate targets $N_{targ}$ (504), a number of transition time error registers are initialized (tranerr[j], j=0 . . . $N_{targ}$-1) to their maximum value (506). The value j can be incremented (508) until the target $N_{targ}$ is reached.

The algorithm then iterates over all slew rate calibration settings (slewset[i], i=0 . . . $N_{set}$-1). The value i is initialized to 0 (510) and as long as value i remains below the total number of calibration settings $N_{set}$ (512), the corresponding slew rate setting is programmed into the replica signal transmitter 202 (514). The phase interpolator 206 is then adjusted accordingly and the sampled voltage from sampling circuit 220 is used by the measurement circuit 210 in order to explicitly measure (516) the peak high and low voltages (i.e. vpkhi and vpklo). The processing logic then uses these measured peak voltages to calculate and store (518) the desired high and low reference voltages (i.e. vmhi and vmlo), as shown above in Equation 1 and Equation 2.

The processing logic then iterates over all replica transmitter outputs (sig[m], m=0 . . . $N_{sig}$-1) and transition edge polarities (pol[n], n=0 . . . $N_{pol}$-1). For example, in one embodiment the replica signal transmitter has a differential output ($N_{sig}$=2) and the algorithm measures both rising edge and falling edge outputs ($N_{pol}$=2). In one embodiment, the value m is initialized to 0 (520) and as long as value m remains below $N_{sig}$ (522), the current replica signal transmitter output sig[m] is selected for sampling (524). In addition, the value n is initialized to 0 (526) and as long as value n remains below $N_{pol}$ (528), the current edge polarity pol[n] is selected for measurement (530). Once the value n reaches $N_{pol}$, the value m can be incremented (521) and again compared to $N_{sig}$ (522).

For each selected replica signal transmitter output sig[m] and selected edge polarity pol[n], the phase interpolator 206 is adjusted and the sampled voltage from sampling circuit 220 is measured by the measurement circuit 210 to determine (532) the reference voltage crossing times (i.e. t_vmlo and t_vmhi). The measured transition time for the selected output and polarity is calculated (534) by taking the difference between t_vmlo and t_vmhi (Equation 3 and Equation 4) and stored as mtran[m,n]. Once the measured transition time is calculated and stored, the value n can be incremented (529) and again compared to $N_{pol}$ (528). After the measured transition time is stored for all outputs/polarities (i.e., the value m reaches $N_{sig}$), the processing logic calculates and stores mtranmid (536), which is a variable the represents the midrange (i.e. average of maximum and minimum) value of mtran[*,*].

As shown in FIG. 5B, the processing logic then iterates over all target slew rates (slewtarg[j], j=0 . . . $N_{targ}$-1). In one embodiment, the value j is initialized to 0 (538) and as long as value j remains below $N_{targ}$ (540), the target transition time for each target slew rate is calculated (542) as a function of the high/low reference voltages (trantarg[j]= (vmhi−vmlo)/slewtarg[j]). In one embodiment, the residual error term is calculated (544) and stored in a temporary error variable (tmperr) as the absolute difference between the midrange measure transition time (mtranmid) and the target transition time (trantarg[j]). If this residual error term is less than tranerr[j] (546), which represents the minimum error from all of these slew rate settings tested so far (i.e. slewset[0 . . . i−1]), then tranerr[j] is updated (548) to reflect this new minimum error (tmperr) and the "best" slew setting variable bestslewset[j] is updated (550) to reflect the current slew rate setting slewset[i].

After temperr has been compared against tranerr[j] and any necessary updates to tranerr[j] and bestslewsel[j] are made, the value j can be incremented (539) and again compared to $N_{targ}$ (540). After mtranmid has been compared against all $N_{targ}$ target slew rates (i.e. the value j reaches $N_{targ}$), the value i is incremented and compared against $N_{set}$ (512). Once the loop has iterated over all $N_{set}$ slew rate settings, the lookup table between target slew rate and optimal rate setting (bestslewset[j], j=0 . . . $N_{targ}$-1) will be fully populated and the system can proceed to select these values accordingly during normal operation.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. An integrated circuit comprising:
a signal transmitter;
a sampling circuit coupled to the signal transmitter, wherein the sampling circuit is to determine a series of output voltage levels of a selected output of the signal transmitter, wherein the output voltage levels of the selected output are captured at different respective times; and
a measurement circuit coupled to the sampling circuit, wherein the measurement circuit is to compare the series of output voltage levels of the selected output of the signal transmitter to corresponding reference voltages to identify a first time when a first output voltage level of the selected output of the signal transmitter equals a first reference voltage and a second time when a second output voltage level of the selected output of the signal transmitter equals a second reference voltage, and wherein a time difference between the first time and the second time is used to configure a slew rate adjustment control of the signal transmitter.

2. The integrated circuit of claim 1, wherein the signal transmitter comprises a replica circuit element in a delay locked loop (DLL) circuit.

3. The integrated circuit of claim 1, further comprising:
a phase interpolator circuit coupled to the sampling circuit, wherein the sampling circuit is to receive a control clock from the phase interpolator circuit to control the different respective times at which the output voltage levels of the output of the signal are sampled.

4. The integrated circuit of claim 3, wherein to identify the first time and the second time, the measurement circuit is to compare a series of output voltage levels of the output of the signal transmitter to the corresponding reference voltages, wherein each output voltage level corresponds to a different time represented by a control code of the phase interpolator circuit.

5. The integrated circuit of claim 3, wherein the sampling circuit comprises:
a first selection circuit to select one of two or more output signals of the signal transmitter;
a capacitor; and
a switching circuit to couple the selected one of the two or more output signals of the signal transmitter received from the first selection circuit to the capacitor, wherein the switching circuit is controlled by a pulse generator based on the control clock from the phase interpolator circuit.

6. The integrated circuit of claim 3, wherein the signal transmitter, the phase interpolator circuit, the sampling circuit, and the measurement circuit are coupled to control logic to receive respective control signals, wherein the signal transmitter to receive a slew rate adjustment control signal from the control logic.

7. The integrated circuit of claim 1, wherein the measurement circuit comprises:
a second selection circuit to select an output of the sampling circuit, wherein the output of the sampling circuit comprises at least one of the first output voltage level or the second output voltage level; and
a comparator circuit to compare the selected output of the sampling circuit to at least one of the first reference voltage or the second reference voltage.

8. The integrated circuit of claim 1, wherein the first reference voltage comprises a low reference voltage associated with a transition of the output of the signal transmitter from a first voltage state to a second voltage state, and wherein the second reference voltage comprises a high reference voltage associated with the transition of the output of the signal transmitter from the first voltage state to the second voltage state.

9. A method of operation of a slew rate calibration circuit, the method comprising:
determining a series of output voltage levels of a selected output of a signal transmitter, wherein the output voltage levels of the selected output are captured at different respective times;
comparing the series of output voltage levels of the selected output of the signal transmitter to corresponding reference voltages to identify a first time when a first output voltage level of the selected output of the signal transmitter equals a first reference voltage and a second time when a second output voltage level of the selected output of the signal transmitter equals a second reference voltage;
determining a time difference between the first time and the second time; and
configuring a slew rate adjustment control of the signal transmitter based on the time difference between the first time and the second time.

10. The method of claim 9, wherein the signal transmitter comprises a replica circuit element in a delay locked loop (DLL) circuit.

11. The method of claim 9, further comprising:
receiving a control clock from a phase interpolator circuit to control the different respective times at which the output voltage levels of the output of the signal are sampled.

12. The method of claim 11, wherein identifying the first time and the second time comprises comparing a series of output voltage levels of the output of the signal transmitter to the corresponding reference voltages, wherein each output voltage level corresponds to a different time represented by a control code of the phase interpolator circuit.

13. The method of claim 11, further comprising:
selecting one of two or more output signals of the signal transmitter; and
coupling the selected one of the two or more output signals of the signal transmitter received from the first selection circuit to a capacitor based on the control clock from the phase interpolator circuit.

14. The method of claim 9, wherein the first reference voltage comprises a low reference voltage associated with a transition of the output of the signal transmitter from a first voltage state to a second voltage state, and wherein the second reference voltage comprises a high reference voltage associated with the transition of the output of the signal transmitter from the first voltage state to the second voltage state.

15. A memory module comprising:
one or more memory devices; and
a data buffer coupled to the one or more memory devices, the data buffer comprising:
a replica signal transmitter;
a sampling circuit coupled to the replica signal transmitter, wherein the sampling circuit is to determine a series of output voltage levels of a selected output of the replica signal transmitter, wherein the output voltage levels of the selected output are captured at different respective times; and
a measurement circuit coupled to the sampling circuit, wherein the measurement circuit is to compare the series of output voltage levels of the selected output of the replica signal transmitter to corresponding reference voltages to identify a first time when a first output voltage level of the selected output of the signal transmitter equals a first reference voltage and a second time when a second output voltage level of the selected output of the signal transmitter equals a second reference voltage, and wherein a time difference between the first time and the second time is used to configure a slew rate adjustment control of the replica signal transmitter.

16. The memory module of claim 15, further comprising:
a phase interpolator circuit coupled to the sampling circuit, wherein the sampling circuit is to receive a control clock from the phase interpolator circuit to control the different respective times at which the output voltage levels of the output of the signal are sampled.

17. The memory module of claim 16, wherein the sampling circuit comprises:
a first selection circuit to select one of two or more output signals of the replica signal transmitter;
a capacitor; and
a switching circuit to couple the selected one of the two or more output signals of the replica signal transmitter received from the first selection circuit to the capacitor, wherein the switching circuit is controlled by a pulse generator based on the control clock from the phase interpolator circuit.

18. The memory module of claim 15, wherein the first reference voltage comprises a low reference voltage associated with a transition of the output of the replica signal transmitter from a first voltage state to a second voltage state, and wherein the second reference voltage comprises a high reference voltage associated with the transition of the output of the replica signal transmitter from the first voltage state to the second voltage state.

19. The memory module of claim 15, wherein the one or more memory devices comprise dynamic random access memory (DRAM) devices.

20. The memory module of claim 16, wherein the signal transmitter, the phase interpolator circuit, the sampling circuit, and the measurement circuit are coupled to control logic to receive respective control signals, wherein the signal transmitter to receive a slew rate adjustment control signal from the control logic.

* * * * *